United States Patent
Mulder et al.

(10) Patent No.: US 10,761,163 B2
(45) Date of Patent: Sep. 1, 2020

(54) CRYOGENIC FIELD SENSING FOR COMPENSATING MAGNETIC FIELD VARIATIONS IN MAGNETIC RESONANCE IMAGING MAGNETS

(71) Applicant: KONINKLIJKE PHILIPS N.V., Eindhoven (NL)

(72) Inventors: Gerardus Bernardus Jozef Mulder, Best (NL); Cornelis Leonardus Gerardus Ham, Oirschot (NL)

(73) Assignee: Koninklijke Philips N.V., Eindhoven (NL)

( * ) Notice: Subject to any disclaimer, the term of this patent is extended or adjusted under 35 U.S.C. 154(b) by 80 days.

(21) Appl. No.: 16/305,946

(22) PCT Filed: Jun. 5, 2017

(86) PCT No.: PCT/EP2017/063597
§ 371 (c)(1),
(2) Date: Nov. 30, 2018

(87) PCT Pub. No.: WO2017/211756
PCT Pub. Date: Dec. 14, 2017

(65) Prior Publication Data
US 2019/0154777 A1 May 23, 2019

Related U.S. Application Data

(60) Provisional application No. 62/346,672, filed on Jun. 7, 2016.

(51) Int. Cl.
*G01R 33/389* (2006.01)
*G01R 33/3815* (2006.01)
(Continued)

(52) U.S. Cl.
CPC ....... *G01R 33/389* (2013.01); *G01R 33/3815* (2013.01); *G01R 33/421* (2013.01); *H01F 6/006* (2013.01)

(58) Field of Classification Search
CPC .............. G01R 33/389; G01R 33/3815; G01R 33/421; H01F 6/006
See application file for complete search history.

(56) References Cited

U.S. PATENT DOCUMENTS

| 4,926,289 A | 5/1990 | Reichert |
| 5,214,383 A | 5/1993 | Perlmutter et al. |

(Continued)

FOREIGN PATENT DOCUMENTS

| DE | 19510142 A1 | 9/1996 |
| JP | 2008020266 A | 1/2008 |

*Primary Examiner* — Dominic E Hawkins

(57) ABSTRACT

A superconducting magnet includes superconducting magnet coils ($C_1$, $C_2$, $C_3$, $C_4$, $C_5$, $C_6$, $S_1$, $S_2$) disposed inside a magnet cryostat (12). The superconducting magnet coils generate a static ($B_0$) magnetic field when an electric current flows in the superconducting magnet coils. A superconducting $B_0$ compensation circuit (30, 60, 70) is also disposed inside the magnet cryostat, and is coupled with the superconducting magnet coils to passively reduce temporal variations in the $B_0$ magnetic field generated by the superconducting magnet coils. An electric current sensor (40) is also disposed inside the magnet cryostat and is connected to measure electric current flowing in the superconducting $B_0$ compensation circuit. An active $B_0$ compensation component (50) is operatively connected with the electric current sensor to receive the measurement of electric current flowing in the superconducting $B_0$ compensation circuit and to provide active $B_0$ magnetic field compensation based on the measured electric current.

20 Claims, 6 Drawing Sheets

(51) Int. Cl.
*G01R 33/421* (2006.01)
*H01F 6/00* (2006.01)

(56) References Cited

U.S. PATENT DOCUMENTS

| | | | |
|---|---|---|---|
| 5,426,366 A * | 6/1995 | Overweg | G01R 33/3815 |
| | | | 324/318 |
| 5,731,704 A | 3/1998 | Schnur et al. | |
| 6,396,268 B1 | 5/2002 | Hinks et al. | |
| 6,731,113 B2 | 5/2004 | Ham et al. | |
| 9,279,871 B2 | 3/2016 | Shen et al. | |
| 2002/0195977 A1 | 12/2002 | Goto et al. | |
| 2003/0016010 A1* | 1/2003 | Kandori | A61B 5/04005 |
| | | | 324/248 |
| 2004/0263165 A1* | 12/2004 | Shen | G01R 33/389 |
| | | | 324/309 |
| 2008/0027666 A1 | 1/2008 | Schenkel et al. | |
| 2009/0219121 A1* | 9/2009 | Atkins | G01R 33/3802 |
| | | | 335/216 |
| 2012/0014030 A1* | 1/2012 | Ichiki | H01F 6/02 |
| | | | 361/141 |
| 2012/0098538 A1* | 4/2012 | Shen | G01R 33/3873 |
| | | | 324/318 |
| 2015/0168517 A1* | 6/2015 | Shen | G01R 33/385 |
| | | | 324/322 |
| 2015/0187478 A1 | 7/2015 | Mallett | |
| 2016/0011288 A1* | 1/2016 | Overweg | A61N 5/1039 |
| | | | 600/411 |

\* cited by examiner

CRYOGENIC FIELD SENSING FOR COMPENSATING MAGNETIC FIELD VARIATIONS IN MAGNETIC RESONANCE IMAGING MAGNETS

CROSS REFERENCE TO RELATED APPLICATIONS

This application is a U.S. national phase application of International Application No. PCT/EP2017/063597, filed on Jun. 5, 2017, which claims the benefit of U.S. provisional Application Ser. No. 62/346,672 filed on Jun. 7, 2016 and is incorporated herein by reference.

FIELD

The following relates generally to the superconducting magnet arts, and to the magnetic resonance imaging and spectroscopy arts employing same.

BACKGROUND

Magnetic resonance (MR) imaging benefits from a static magnetic field that is stable over time. The main (or static) magnetic field of the MRI scanner is commonly denoted as the $B_0$ magnetic field, and has a high value to align nuclear spins (in a statistical sense). In some MR scanners used for medical imaging, $B_0$ is in the range 0.2 Tesla to 3.0 Tesla, and even higher values, e.g. $B_0$=7 Tesla, are used in research applications. Superconducting magnets are generally used to achieve these high magnetic fields. Some suitable superconducting materials for fabricating the superconducting magnet windings include niobium-titanium, niobium-tin, or so forth which have a critical temperature ($T_C$) that is typically below 20K. Thus, the superconducting magnet windings are immersed in liquid helium (LHe) contained in a vacuum-jacketed LHe dewar or are disposed in some other type of cryostat to maintain the windings at suitably low cryogenic temperature. In magnets employing superconducting materials with higher $T_C$, the magnet cryostat can take other forms such as being immersed in liquid nitrogen ($LN_2$) or vacuum.

However, small temporal $B_0$ variations on the order of only a few nT can degrade the MR image quality. The amount of nT variation that can be tolerated in typical medical imaging applications depends on the frequency and ranges from about 1 to 100 nT at 0.01 to 100 Hz. The tolerable variation is thus in the parts-per-billion (ppb) range. $B_0$ variation larger than this can easily be caused by external sources around the MR scanner, such as electricity lines or moving magnetic objects like trains, cars, elevators in the neighborhood of the scanner. Therefore, MR magnets typically are provisioned for compensating external field variations in order to have good image quality. Such a provision is referred to herein as a $B_0$ compensation system. The design goal for a $B_0$ compensation system is typically to reduce external $B_0$ magnetic field disturbances by a factor 10 to 100. The $B_0$ magnetic field disturbances reduction factor is referred to herein as the shield factor—a higher shield factor corresponds to better $B_0$ compensation. (The "external" $B_0$ field refers to the $B_0$ field outside of the magnet itself, and typically refers to the $B_0$ field in the imaging field-of-view (FOV), e.g. at the isocenter of the bore of a horizontal-bore type MR scanner).

Various types of $B_0$ compensation systems have been developed. In active compensation approaches, a magnetic field sensor is installed in or near to the imaging FOV, and the measured magnetic field is used for feedback control to actively counter $B_0$ magnetic field disturbances. One way to actively compensate for $B_0$ variation is to actively apply a compensating magnetic field. For example, control electronics may drive one or more coils to generate a compensating field at the magnet. Alternatively, since the magnetic resonance frequency is proportional to the magnetic field (with the gyromagnetic ratio serving as the proportionality constant), the active compensation can be a frequency adjustment performed on the measured MR signals (e.g., in software).

Other types of $B_0$ compensation systems are passive, and entail adding superconducting circuitry disposed with the superconducting magnet windings in the magnet cryostat. Some passive $B_0$ compensation systems are described in, e.g. Reichert, U.S. Pat. No. 4,926,289 ("Actively shielded, superconducting magnet of an NMR tomography apparatus") and Overweg, U.S. Pat. No. 5,426,366 ("Magnetic resonance apparatus comprising a superconducting magnet"). These designs are based on the principle that a superconducting circuit keeps its magnetic flux constant. In one design, the $B_0$ compensation circuit is electrically connected with the magnet windings, with the connection made at strategically chosen locations, typically within winding coils. By designing the connection point properly, it is possible to obtain a shield factor of more than 100. In an alternative design, magnetic coupling of windings of the $B_0$ compensation circuit with the magnet windings is substituted for the electrical connection. Again, with proper coupling design a shield factor of more than 100 can be obtained for quasi-DC disturbances.

It is recognized herein that these existing $B_0$ compensation systems have certain disadvantages. In the case of active $B_0$ compensation, sufficiently accurate $B_0$ measurements (accuracy in the ppb range) are difficult to obtain due to factors such as difficulty in positioning the magnetic field sensor close to (and preferably symmetric respective to) the imaging FOV. In the case of passive $B_0$ compensation, the gain is fixed and cannot be adjusted for less homogenous disturbance sources. It is also not generally feasible to compensate for disturbances that are not-quasi DC. This type of disturbance has a fixed frequency response. The metallic cryostat of the magnet influences the response of the passive $B_0$ compensation system and this cannot be corrected because the compensation is passive and non-adjustable. In the case of a passive $B_0$ compensation system with electrical connection to the MR magnet, the optimal connection points are usually inside of coil windings of the MR magnet, requiring extra lead-in-lead-out connections at the coil which adds manufacturing cost and complexity. In the case of a passive $B_0$ compensation system with inductive coupling to the MR magnet, the compensation circuit requires extra wound superconducting coils, which must be designed to meet the shield factor design basis (e.g. a shield factor of at least 100 in some designs), which again increases cost and manufacturing complexity.

The following discloses a new and improved systems and methods that address the above referenced issues, and others.

SUMMARY

In one disclosed aspect, a superconducting magnet comprises: a magnet cryostat; superconducting magnet coils disposed inside the magnet cryostat and configured to generate a static ($B_0$) magnetic field when an electric current flows in the superconducting magnet coils; a superconducting $B_0$ compensation circuit disposed inside the magnet cryostat and coupled with the superconducting magnet coils to reduce temporal variations in the $B_0$ magnetic field generated by the superconducting magnet coils; and an electric current sensor disposed inside the magnet cryostat and connected to measure electric current flowing in the superconducting $B_0$ compensation circuit.

In another disclosed aspect, a method of operating a superconducting magnet is disclosed. The method comprises: using a magnet cryostat, cooling superconducting magnet coils and a superconducting $B_0$ compensation circuit coupled with the superconducting magnet coils; electrically energizing the superconducting magnet coils to generate a static ($B_0$) magnetic field; reducing temporal variations in the $B_0$ magnetic field using the superconducting $B_0$ compensation circuit; using an electric current sensor disposed inside the magnet cryostat, measuring electric current flowing in the superconducting $B_0$ compensation circuit; and performing active $B_0$ compensation (and/or gradient compensation with a priori knowledge of the source location) based on the measured electric current flowing in the superconducting B0 compensation circuit.

In another disclosed aspect, a magnetic resonance (MR) imaging device is disclosed. A superconducting magnet includes a magnet cryostat, superconducting magnet coils disposed inside the magnet cryostat, a superconducting $B_0$ compensation circuit disposed inside the magnet cryostat and coupled with the superconducting magnet coils, and an electric current sensor disposed inside the magnet cryostat and connected to measure electric current flowing in the superconducting $B_0$ compensation circuit. An active $B_0$ compensation component is operatively connected with the electric current sensor to receive the measurement of electric current flowing in the superconducting $B_0$ compensation circuit. The active $B_0$ compensation component is configured to provide active $B_0$ magnetic field compensation based on the electric current flowing in the superconducting $B_0$ compensation circuit.

One advantage resides in providing a $B_0$ compensation system with reduced manufacturing cost.

Another advantage resides in providing a $B_0$ compensation system with relaxed design constraints.

Another advantage resides in providing a $B_0$ compensation system with active sensing without the need to install a magnetic field sensor in or proximate to the imaging field-of-view (FOV).

Another advantage resides in providing a $B_0$ compensation system that synergistically leverages a passive superconducting $B_0$ compensation circuit as a surrogate for an external magnetic field sensor to provide active $B_0$ compensation.

Another advantage resides in providing a $B_0$ compensation system that synergistically leverages a passive superconducting $B_0$ compensation circuit to provide coarse $B_0$ compensation and a cryogenic magnetic field sensor providing an additional component of active $B_0$ compensation.

Another advantage resides in providing a $B_0$ compensation system with a magnetic field sensor installed inside the magnet cryostat and hence with reduced thermal sensor noise compared with an externally located magnetic field sensor.

A given embodiment may provide none, one, two, more, or all of the foregoing advantages, and/or may provide other advantages as will become apparent to one of ordinary skill in the art upon reading and understanding the present disclosure.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention. Unless otherwise noted, the drawings are diagrammatic and are not to be construed as being to scale or to illustrate relative dimensions of different components.

DETAILED DESCRIPTION

In $B_0$ compensation device embodiments disclosed herein, a superconducting $B_0$ compensation circuit is synergistically combined with a cryogenic electric current sensor disposed inside the magnet cryostat that senses the electric current flowing in the superconducting $B_0$ compensation circuit. The cryogenic electric current sensor serves as a surrogate for a magnetic field sensor to perform active $B_0$ compensation in addition to coarse $B_0$ compensation provided by the superconducting $B_0$ compensation circuit. Viewed another way, the passive superconducting $B_0$ compensation circuit, in addition to its usual function to provide passive $B_0$ compensation, serves the additional role of a surrogate magnetic field sensor for performing active compensation of disturbances to be corrected.

Such arrangements have substantial advantages. The design and production tolerance of the superconducting $B_0$ compensation circuit is made less critical since it performs only partial shielding (i.e., coarse $B_0$ compensation). The effective shield factor is achieved by the combination of passive compensation from the superconducting $B_0$ compensation circuit and active compensation provided based on the measured electric current (which serves as a surrogate for the $B_0$ magnetic field measurement usually used in active compensation). This enables lowered cost of design and manufacturing for the superconducting $B_0$ compensation circuit. Another advantage is that the shield factor can be adjusted in gain as well as in frequency response, thereby enabling improved performance. Yet another advantage is that the cryogenic electric current sensor can employ a solenoidal coil/magnetic field sensor to provide high sensitivity because flux transformation by a multiple-turns solenoidal coil and/or suitable orientation of the magnetic field sensor relative to the $B_0$ field inside the magnet cryostat can be employed to amplify the magnetic field measured by the magnetic field sensor relative to any disturbing source field. In addition the cryogenic electric current sensor, regardless of design, has reduced intrinsic thermal noise because it operates at low temperature. Still yet another advantage is that the magnetic field sensor conventionally used for active $B_0$ compensation, and which has to be placed in or proximate to the imaging field of view (FOV), is replaced by an electric current sensor located inside the magnet cryostat, freeing up valuable space in or near the imaging FOV.

Figure 1:
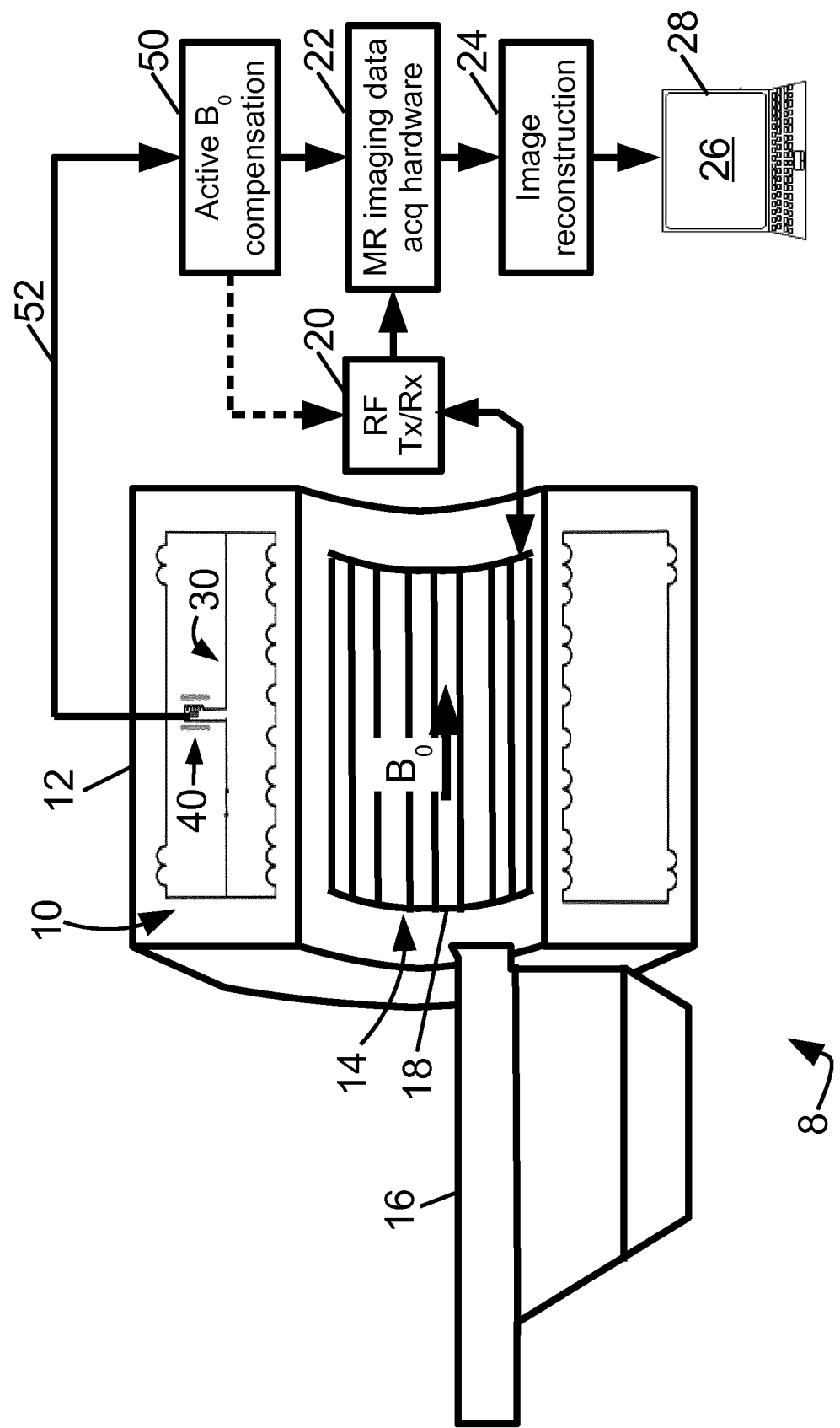
FIG. 1 diagrammatically shows a side sectional view of a magnetic resonance (MR) imaging device including a superconducting magnet with a $B_0$ compensation system as disclosed herein.

With reference to FIG. 1, an illustrative magnetic resonance (MR) imaging device 8 includes a superconducting magnet 10 disposed in a magnet cryostat 12. The magnet cryostat 12 maintains the superconducting coils of the magnet 10 at a temperature below the superconducting critical temperature. Some illustrative superconducting materials suitable for fabricating the superconducting magnet coils include niobium-titanium, niobium-tin, or so forth which have a critical temperature ($T_C$) that is typically below 20K. In some embodiments, the magnet cryostat 12 comprises a vacuum-jacketed liquid helium (LHe) dewar and the magnet coils are immersed in LHe inside the LHe dewar to maintain the windings at suitably low cryogenic temperature. However, other magnet cryostat designs are contemplated, e.g. designs in which the magnet coils are disposed in a vacuum space maintained at a temperature below $T_C$. In the illustrative embodiment, the magnet 10 is a horizontal solenoidal superconducting magnet 10 defining a horizontal bore 14 into which a patient or other imaging subject is inserted for MR imaging and/or spectroscopy after loading onto a couch or other patient support 16. This is merely an illustrative embodiment, and other superconducting magnet designs are contemplated, e.g. a vertical bore magnet.

The superconducting magnet 10 generates a static ($B_0$) magnetic field as indicated in FIG. 1. In the illustrative horizontal bore design the $B_0$ vector is oriented horizontally, but other orientations may be employed depending upon the magnet design. The static ($B_0$) magnetic field is intended to be temporally constant (other than during initial ramp-up when bringing the MR imaging device 8 online; or during ramp-down for maintenance or so forth), and is typically a strong field, e.g. having magnitude $|B_0|$ in the range 0.2-7.0 Tesla in some designs, although higher or lower field strengths are also contemplated. The illustrative MR imaging device 8 further includes a radio frequency (RF) coil 18, which in the illustrative embodiment is a cylindrical whole-body birdcage coil, although other designs such as a transverse electromagnetic (TEM) RF coil may be used. Additionally, the illustrative single whole-body RF coil 18 may be replaced or supplemented by one or more local RF coils, e.g. as another non-limiting illustrative example the whole-body RF coil may be used as a transmit coil to excite MR in the subject and a separate local receive coil, phased-array coil array, or the like may be used as the MR signal receiver. The chosen configuration of RF coil(s) is driven by transmit/receive (Tx/Rx) electronics 20, e.g. a radio frequency transmitter tuned to excite the RF coil(s) at a magnetic resonance frequency (denoted herein as $f_0$) to generate magnetic resonance in an imaging subject, and RF receive electronics receive the MR signal. FIG. 1 is diagrammatic, and the MR imaging device typically includes numerous other conventional components which are not shown in FIG. 1, such as resistive magnetic field gradient coils for manipulating and/or spatially encoding the MR signals.

The MR imaging system 8 is suitably used in known ways to acquire MR imaging and/or spectroscopy data. For example, in one illustrative imaging sequence, the operating superconducting magnet 10 produces the static ($B_0$) magnetic field in an imaging FOV within the bore 14. The $B_0$ magnetic field (statistically) orients nuclear spins, which are excited by RF pulses applied by the RF system 18, 20. The excited magnetic resonance is spatially limited and/or phase- and/or frequency-encoded by magnetic field gradients applied by the magnetic field gradient coils (not shown), and the thusly manipulated excited magnetic resonance are detected by the RF system 18, 20 and processed by MR imaging data acquisition hardware 22 to generate MR imaging data. The acquisition hardware 22 may, for example, comprise a computer programmed to receive digitized MR signals from the RF transceiver 20 (or may include analog-to-digital conversion circuitry if the RF transceiver 20 produces an analog output) and to optionally perform pre-processing on the MR signals such as frequency and/or phase adjustment or correction, formatting as k-space data, or so forth. The acquisition hardware 22 typically further includes a non-transitory storage medium for storing the (optionally pre-processed) MR data, e.g. the non-transitory storage medium may be a hard disk, RAID disk assembly, solid state drive (SSD), or so forth. An image reconstruction component 24, for example embodied by a suitably programmed computer with optional additional components such as application-specific integrated circuitry (ASIC), executes an image reconstruction algorithm suitable for the chosen spatial encoding to reconstruct an MR image from the acquired MR imaging data. Additionally or alternatively, the excited and detected magnetic resonance may be analyzed spectroscopically. The resulting data is displayed on a display component 26 of a computer 28 or other electronic data presentation device (e.g. printed on a printer or so forth). In some embodiments, the presentation computer 28 may also embody various processing components 22, 24.

Figure 2:
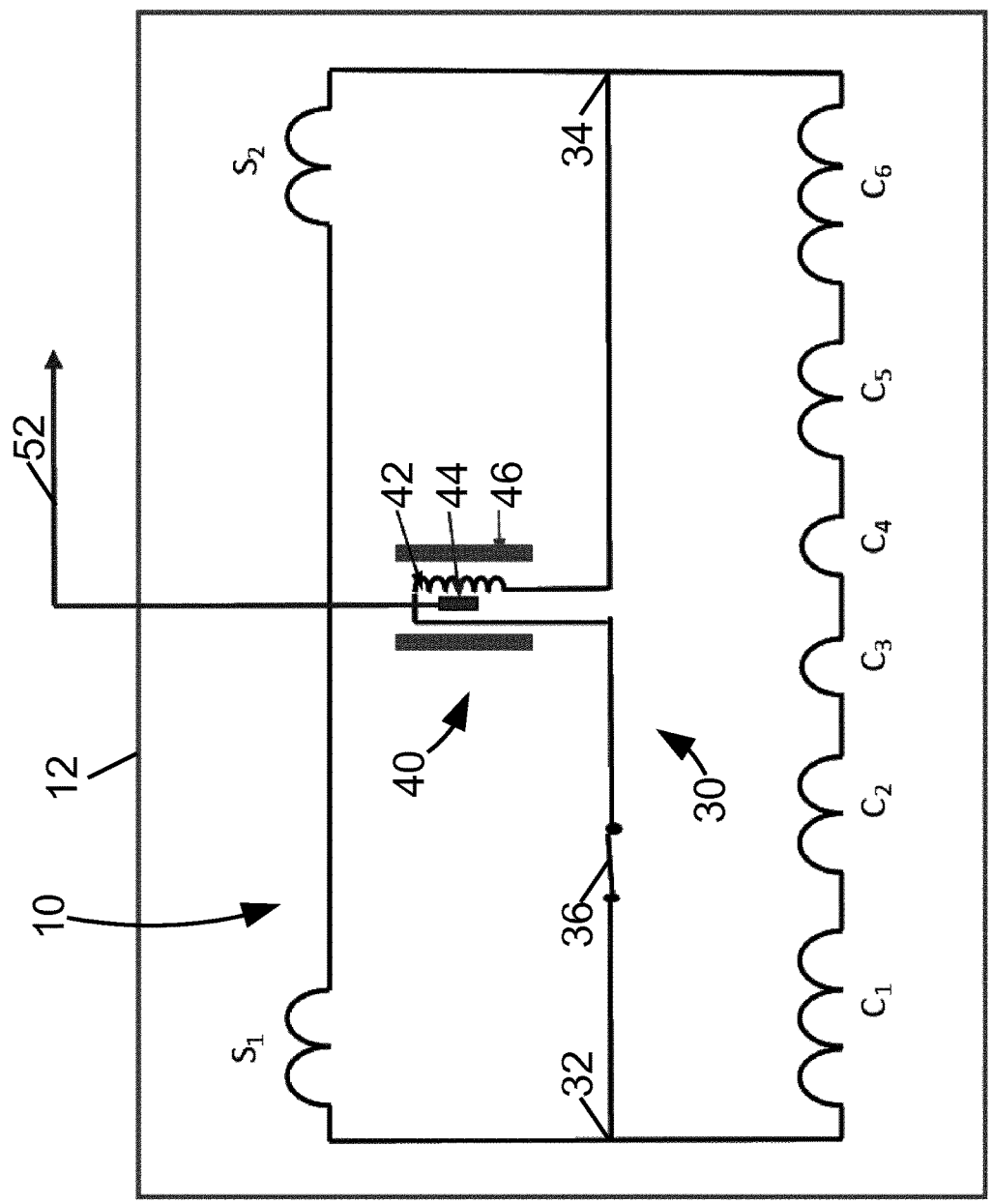
FIG. 2 diagrammatically shows an enlarged side sectional view of the $B_0$ compensation system of FIG. 1.

With continuing reference to FIG. 1 and with further reference to FIG. 2, the superconducting magnet 10 disposed in the magnet cryostat 12 is described in further detail. Note that most components of the magnet 10 are labeled in FIG. 2 but not in FIG. 1. The superconducting magnet 10 comprises a plurality of superconducting magnet coils $C_1$, $C_2$, $C_3$, $C_4$, $C_5$, $C_6$, $S_1$, $S_2$ disposed inside the magnet cryostat 12 and configured to generate the static ($B_0$) magnetic field when an electric current flows in the superconducting magnet coils $C_1$, $C_2$, $C_3$, $C_4$, $C_5$, $C_6$, $S_1$, $S_2$. The illustrative superconducting magnet 10 includes six main coils $C_1$, $C_2$, $C_3$, $C_4$, $C_5$, $C_6$ and two shield coils $S_1$, $S_2$; however, the number of main coils can be other than six, and the number of shield coils can be other than two. Furthermore, it is contemplated to omit the shield coils entirely. The superconducting magnet coils $C_1$, $C_2$, $C_3$, $C_4$, $C_5$, $C_6$, $S_1$, $S_2$ may comprise windings of any suitable superconducting material such as niobium-titanium, niobium-tin, or so forth disposed in a copper matrix; use of a high-temperature superconducting material is also contemplated. The superconducting magnet 10 may include other components not shown in diagrammatic FIG. 2, such as terminals accessible via a port in the magnet cryostat 12 to connect a DC power supply to ramp the magnet electrical current, vacuum jacketing of the magnet cryostat 12, or so forth. The positions, number of windings in each coil, and other design characteristics of the magnet coils $C_1$, $C_2$, $C_3$, $C_4$, $C_5$, $C_6$, $S_1$, $S_2$ are designed to produce the static $B_0$ magnetic field in the imaging FOV with high spatial uniformity over the FOV.

With continuing reference to FIGS. 1 and 2, the superconducting magnet 10 further includes a superconducting $B_0$ compensation circuit 30 disposed inside the magnet cryostat 12 and coupled with the superconducting magnet coils $C_1$, $C_2$, $C_3$, $C_4$, $C_5$, $C_6$, $S_1$, $S_2$ to reduce temporal variations in the $B_0$ magnetic field generated by the superconducting magnet coils. In the embodiment of FIG. 2, this coupling is by electrical connections 32, 34 of the superconducting $B_0$ compensation circuit 30 with terminals connecting between the main magnet coils $C_1$, $C_2$, $C_3$, $C_4$, $C_5$, $C_6$ and the shield coils $S_1$, $S_2$. The illustrative superconducting $B_0$ compensation circuit 30 comprises a superconducting short across the main magnet coils $C_1$, $C_2$, $C_3$, $C_4$, $C_5$, $C_6$ (or, equivalently, across the shield coils $S_1$, $S_2$). The superconducting $B_0$ compensation circuit 30 also includes a superconducting switch 36 for the purpose of resetting the circuit 30 to eliminate undesired accumulated current, or for opening the circuit 30 during magnet ramping and quench. Some suitable designs of the superconducting $B_0$ compensation circuit 30 are described, for example, in e.g. Reichert, U.S. Pat. No. 4,926,289 ("Actively shielded, superconducting magnet of an NMR tomography apparatus") and Overweg, U.S. Pat. No. 5,426,366 ("Magnetic resonance apparatus comprising a superconducting magnet"). However, it is sufficient for the superconducting $B_0$ compensation circuit 30 to provide only coarse $B_0$ compensation (e.g. a shield factor on the order of 10, although higher or lower values are contemplated). As a consequence, design constraints can be relaxed—for example, while such a superconducting $B_0$ compensation circuit usually must be connected inside magnet coils to achieve the design-basis shield factor, in the embodiment of FIG. 2 the connections 32, 34 are made at terminals external to any of the superconducting magnet coils $C_1$, $C_2$, $C_3$, $C_4$, $C_5$, $C_6$, $S_1$, $S_2$, which simplifies manufacturing.

The $B_0$ compensation of FIGS. 1 and 2 further includes an active component operating on the basis of a surrogate signal substituting for the usual measurement of the external $B_0$ magnetic field in (or near) the imaging FOV. To this end, an electric current sensor 40 is disposed inside the magnet cryostat 12 and connected to measure electric current flowing in the superconducting $B_0$ compensation circuit 30. This measurement of the electric current flowing in the superconducting $B_0$ compensation circuit 30 is the surrogate signal used for active $B_0$ compensation. The electric current sensor 40 is a cryogenic current sensor since during operation it is disposed inside the magnet cryostat 12 and accordingly is kept at cryogenic temperature, e.g. below the critical temperature $T_C$ for superconductivity of the superconducting magnet coils. The illustrative electric current sensor 40 includes: a superconducting sensor coil 42 electrically connected with the superconducting $B_0$ compensation circuit 30 to generate a sensor coil magnetic field in response to the electric current flowing in the superconducting $B_0$ compensation circuit 30 passing through the superconducting sensor coil 40; and a magnetic field sensor 44 arranged to measure the sensor coil magnetic field. An optional magnetic shield 46 may surround the superconducting sensor coil 42 and the magnetic field sensor 44. By way of illustration, in one embodiment the magnetic field sensor may be a Hall effect sensor, although other magnetic field sensors may be employed. It should be noted that in this illustrative current sensor design the sensor coil 42 is superconducting, but the magnetic field sensor 44 is not necessarily a superconducting component (although it is operable at the cryogenic temperature, e.g. below $T_C$). Although not so shown in diagrammatic FIG. 2, for maximum sensitivity the magnetic field sensor 44 is preferably disposed inside the superconducting sensor coil 42, which may for example be a solenoidal coil so that the magnetic field generated by the current flowing in the $B_0$ compensation circuit 30 (and hence also through the sensor coil 42) is amplified by the number of turns of the solenoidal coil. The optional magnetic shield 46 blocks the $B_0$ field inside the magnet cryostat 12, and/or any magnetic disturbances, from interfering with operation of the electric current sensor. In some suitable embodiments, the magnetic shield 46 may be an aluminum or copper cylindrical shield at least partially surrounding the coil/sensor assembly 42, 44. Reduction in magnetic interference may additionally or alternatively be obtained by suitable orientation of the components 42, 44—in illustrative FIG. 2 the solenoidal sensor coil 42 is oriented to produces its magnetic field vector oriented transverse to the $B_0$ field vector, and if the magnetic field sensor 44 is a planar Hall effect sensor then it may be oriented so that it detects the magnetic field generated by the solenoidal sensor coil 42 but is insensitive to the $B_0$ magnetic field.

With continuing reference to FIGS. 1 and 2, and with particular focus on FIG. 1, the cryogenic electric current sensor 40 outputs a signal that is received by an active $B_0$ compensation component 50. In illustrative FIGS. 1 and 2, this signal is conveyed via an electrical connection 52, e.g. a wire connected with the magnetic field sensor 44 and passing through a cryostat feedthrough (not shown) to the active $B_0$ compensation component 50. (Note that since the magnetic field sensor 44 is not itself a superconducting component, this wire does not need to be superconducting, thereby simplifying construction). In alternative embodiments (not shown), it is contemplated for the cryogenic electric current sensor 40 to include a wireless transmitter that wirelessly transmits the output of the magnetic field sensor 44 to the active $B_0$ compensation component 50.

The active $B_0$ compensation component 50 can use any conventional $B_0$ compensation mechanism. For example, in some embodiments the active $B_0$ compensation component 50 provides active $B_0$ magnetic field compensation based on the electric current flowing in the superconducting $B_0$ compensation circuit 30 by adjusting the MR frequency of the MR imaging data acquired by the MR imaging device 8. This approach is diagrammatically indicated in FIG. 1 by the solid arrow feeding output of the $B_0$ compensation component 50 into the imaging data acquisition hardware 22, and is described in further detail later herein with reference to FIG. 6. In another embodiment, the active $B_0$ compensation component 50 provides the active $B_0$ magnetic field compensation by adjusting the MR frequency of the MR imaging device 8, e.g. by controlling the RF transceiver components 20 as diagrammatically indicated in FIG. 1 by the dashed output arrow running from the $B_0$ compensation component 50 to the RF transceiver components 20. In yet another illustrative approach, the active $B_0$ compensation component 50 provides the active $B_0$ magnetic field compensation by generating a compensatory magnetic field, e.g. by electrically energizing resistive or superconducting compensation coils (not shown). See, e.g. Ham et al., U.S. Pat. No. 6,731,113 ("Method of and device for the compensation of variations of the main magnetic field during magnetic resonance imaging").

Figure 3:
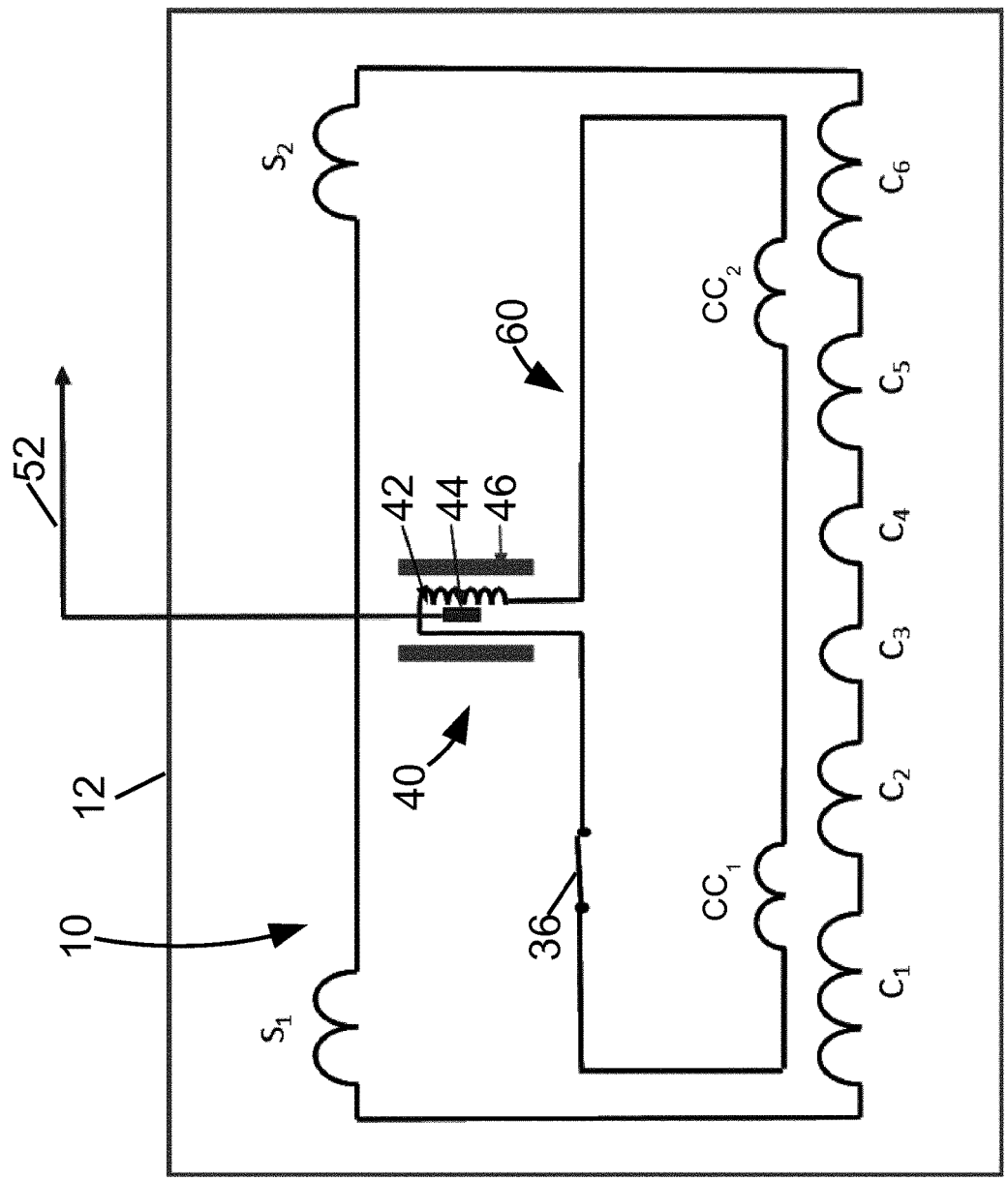
FIGS. 3 and 4 diagrammatically show alternative $B_0$ compensation system embodiments that may be substituted for the $B_0$ compensation system of FIGS. 1 and 2.

With reference to FIG. 3, in an alternative embodiment the superconducting $B_0$ compensation circuit 30 of FIG. 2 with its electrical connections 32, 34 to the magnet coils is replaced by a superconducting $B_0$ compensation circuit 60 that is coupled with the superconducting magnet coils by inductive coupling between compensation circuit coils $CC_1$, $CC_2$ of the $B_0$ compensation circuit 60 and the superconducting main magnet coils $C_1$, $C_2$, $C_3$, $C_4$, $C_5$, $C_6$. The superconducting $B_0$ compensation circuit 60 of FIG. 3 also includes the previously described superconducting switch 36 for the purpose of resetting the circuit 60, and has connected the previously described cryogenic electric current sensor 40 comprising (in the illustrative example) the superconducting sensor coil 42 and magnetic field sensor 44 arranged to measure the sensor coil magnetic field, along with the optional magnetic shield 46. As with the embodiment of FIG. 2, it is sufficient for the superconducting $B_0$ compensation circuit 60 of FIG. 3 to provide only coarse $B_0$ compensation (e.g. a shield factor on the order of 10). As a consequence, design constraints can be relaxed—for example, a smaller number of compensation circuit coils $CC_1$, $CC_2$ may be used for the coupling, e.g. only two compensation circuit coils $CC_1$, $CC_2$ in illustrative FIG. 3, which simplifies manufacturing.

Figure 4:
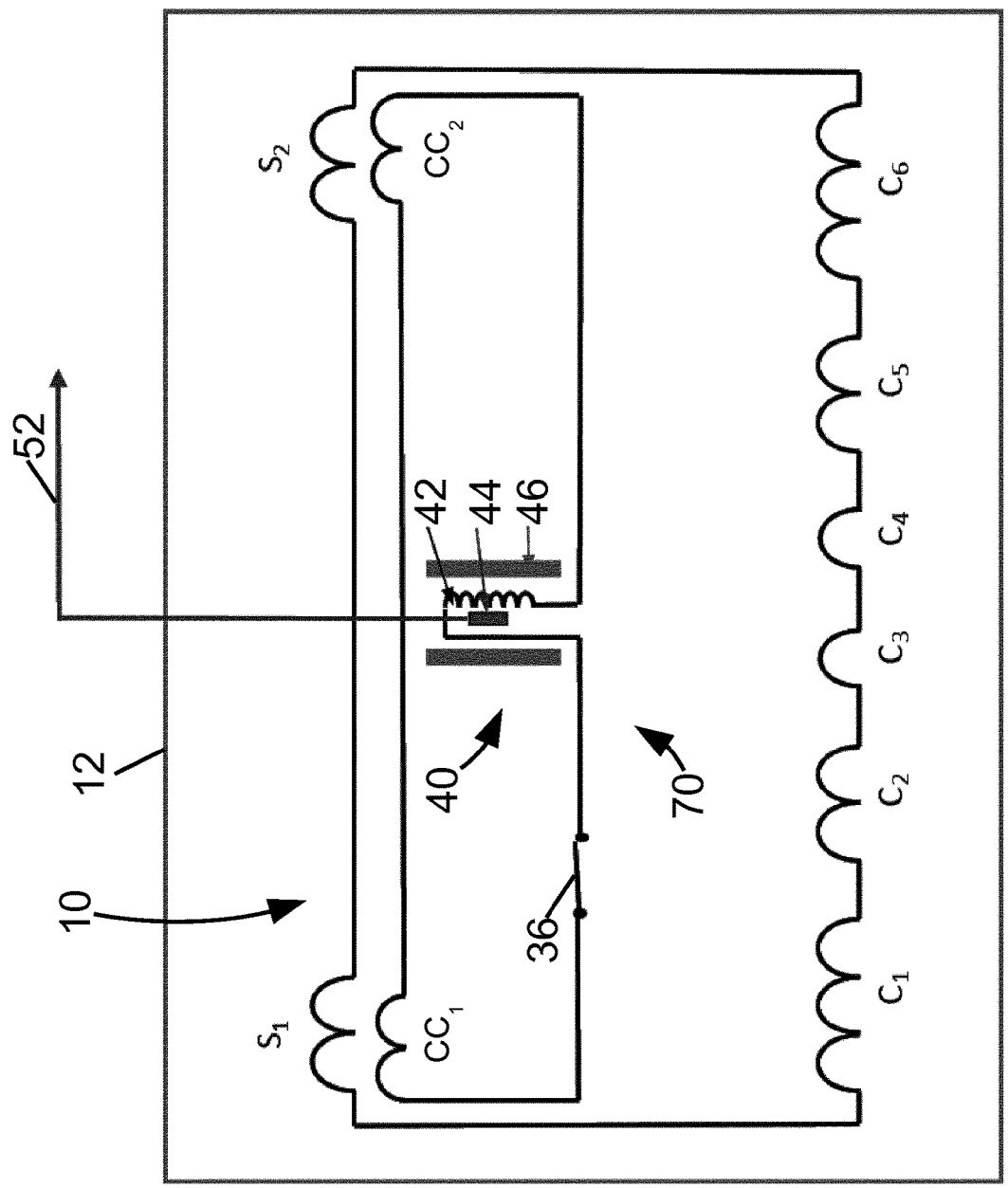

With reference to FIG. 4, in another alternative embodiment a superconducting $B_0$ compensation circuit 70 is similar to the circuit 60 of FIG. 3, but is coupled with the shield coils $S_1$, $S_2$— specifically, in the illustrative example of FIG. 1 the compensation circuit coil $CC_1$ is coupled with the shield coil $S_1$ and the compensation circuit coil $CC_2$ is coupled with the shield coil $S_2$. The superconducting $B_0$ compensation circuit 70 of FIG. 4 also includes the previously described superconducting switch 36 for the purpose of resetting the circuit 70, and has connected the previously described cryogenic electric current sensor 40 comprising (in the illustrative example) the superconducting sensor coil 42 and magnetic field sensor 44 arranged to measure the sensor coil magnetic field, along with the optional magnetic shield 46. Again, it is sufficient for the superconducting $B_0$ compensation circuit 70 to provide only coarse $B_0$ compensation (e.g. a shield factor on the order of 10). As a consequence, design constraints can be relaxed—for example, the smaller number of compensation circuit coils $CC_1$, $CC_2$ may be used.

In the embodiment of FIG. 4, the compensation circuit coils $CC_1$, $CC_2$ of the $B_0$ compensation circuit 70 are located at a larger radius respective to the axis of the bore 14 (i.e., far away from the magnet iso-center), and are located close to the shield coils $S_1$, $S_2$. This can have certain advantages. The compensation circuit coils $CC_1$, $CC_2$ in this arrangement can have a large pick-up area, generate a relatively small correction field at the imaging FOV, and generate relatively homogenous field at the imaging FOV. The skilled artisan might expect that the configuration of the $B_0$ compensation circuit 70 results in small passive compensation because the compensation coils $CC_1$, $CC_2$ are far from the magnet iso-center, but this is not necessarily true because there is also some coupling of the compensation coils $CC_1$, $CC_2$ with the main magnet coils $C_1$, $C_2$, $C_3$, $C_4$, $C_5$, $C_6$ in the configuration of FIG. 4. Electric current changes in the $B_0$ compensation circuit 70 will induce current change in the main magnet coils $C_1$, $C_2$, $C_3$, $C_4$, $C_5$, $C_6$ of the magnet, which also give a compensation field that contributes to the passive $B_0$ compensation component.

Figure 5:
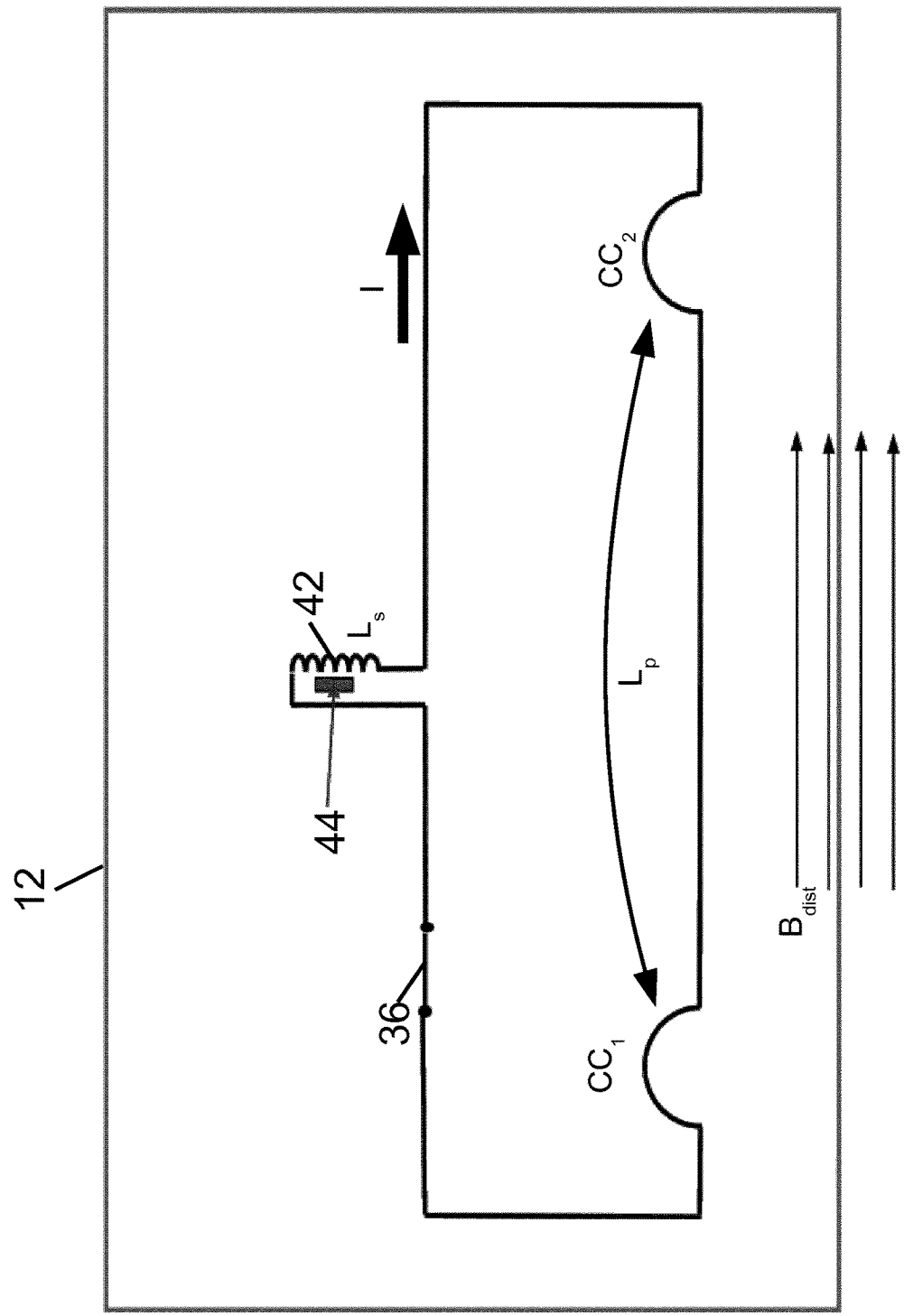
FIG. 5 diagrammatically shows an electrical schematic demonstrating an approach for obtaining signal amplification in $B_0$ compensation system embodiments disclosed herein.

With reference now to FIG. 5, an electrical schematic is shown of the extra field coil connected in series with the $B_0$ compensation circuit 60 or the $B_0$ compensation circuit 70. With reference to FIG. 5, it is explained how to obtain field amplification in these embodiments. The design of the compensation coils $CC_1$, $CC_2$ is optimized to give maximum field amplification at the magnetic field sensor 44 relative to the disturbing field $B_{dist}$ (in other words, to optimally concentrate the field at the magnetic field sensor 44). The disturbing field $B_{dist}$ from the external source is picked up by the large diameter compensation coils $CC_1$, $CC_2$ of the $B_0$ compensation circuit 60, 70. All compensation coils $CC_1$, $CC_2$ of the compensation circuit are connected electrically in series and effectively operate as a single pick-up coil for coupling the disturbing field $B_{dist}$—this single effective pickup coil is represented in FIG. 5 as the inductance $L_p$. The total summed area of all compensation coils $CC_1$, $CC_2$ is $A_p$.

Further, there is the superconducting sensor coil 42 surrounding (or at least coupled with) the magnetic field sensor 44, and the inductance of this sensor coil 42 is represented by the inductance $L_s$. The sensor coil 42 has $n_s$ turns, total summed area $A_s$, and a field constant $k_s$.

If the external field (or actually its z-component) changes by an amount $B_{dist}$ (this is the disturbing field $B_{dist}$), then this generates a magnetic flux $B_{dist} \cdot A_p$ in the $B_0$ compensation circuit 60 or the $B_0$ compensation circuit 70. This gives a current change, denoted I in FIG. 5, in the $B_0$ compensation circuit which gives a field change $B_s = I \cdot k_s$ at the magnetic field sensor 44. The induced current I can be calculated from the fact that the total flux in a superconducting circuit remains constant. So we have:

$$B_s = I \cdot k_s \text{ and}$$

$$B_{dist} \cdot A + I \cdot (L_p + L_s) = 0$$

so that $$B_s/B_{dist} = -k_s \cdot A_p/(L_p + L_s)$$

An illustrative design process is as follows. Start from given compensation coils $CC_1$, $CC_2$ that follow from practical considerations, such as where the compensation coils $CC_1$, $CC_2$ can be easily wound and how many turns are practically employed. These considerations define the compensation coils $CC_1$, $CC_2$ and more particularly their values of $A_p$ and $L_p$. The values of $L_s$ and $k_s$ are then optimized so that the ratio $B_s/B_{dist}$ is maximized. One can see that the sensor coil 42 providing $L_s$ should be a small coil with a high number of turns relative to $L_p$. In a suitable approach, the inductance $L_s$ is chosen by practical considerations. A suitable target is $L_s \approx L_p$ as this yields an optimal flux transformer. Then, determine the smallest diameter of coil $L_s$ that will just fit around the magnetic field sensor 44. Finally, the number of turns $n_s$ of the sensor coil 42 is increased until $L_s \approx L_p$.

As an example, the following approximate values can be found if the compensation coils $CC_1$, $CC_2$ defining $L_p$ have two turns each of 1.50 meter diameter, while the sensor coil 42 defining $L_s$ has 68 turns wound on a small tube of 6 mm diameter. In this case, $A_p = 1.8 \text{ m}^2$, $L_p = 18 \text{ μH}$, $L_s = 18 \text{ μH}$, and $k_s = 0.01 \text{ T/A}$. This will then provide a field amplification of $B_s/B_{dist} = 500$. This is merely an illustrative example, and more generally the values can be selected based on the actual geometry of the coils. In addition, the coupling with the main coils of the magnet is optionally taken into account, although this has been neglected in the foregoing example for the sake of illustrative simplicity. It is seen that a very significant field amplification can be obtained by the foregoing approach. Due to this amplification a lower cost magnetic field sensor can be used, and/or a better sensitivity can be obtained for a given magnetic field sensor.

The magnetic field sensor 44 is preferably located at a position in the magnet cryostat 12 where the main $B_0$ field of the magnet 10 is relatively low in amplitude and in spatial gradient. Also, also the magnetic field sensor 44 should be oriented transverse to the main $B_0$ magnetic field so that it has low or zero sensitivity to the $B_0$ field. These approaches, alternatively or in combination, reduce the potential effect of vibration-induced field errors, and facilitate the use of a magnetic field sensor with limited range, for example a conventional Hall probe, giant magnetoresistance (GMR) sensor, or flux-gate magnetometer.

Alternatively, the magnetic field sensor can be a magnetic resonance (MR) based probe, since the MR device 8 has the infrastructure to drive and read such an MR probe. In this variant embodiment, the MR probe orientation must be aligned with the main $B_0$ magnetic field. The position in the magnet should be chosen where the field is reasonably homogeneous and if that is a high field area it is not problematic. With this probe, the amplification $B_s/B_{dist}$ becomes less important because an MR probe has high sensitivity.

Figure 6:
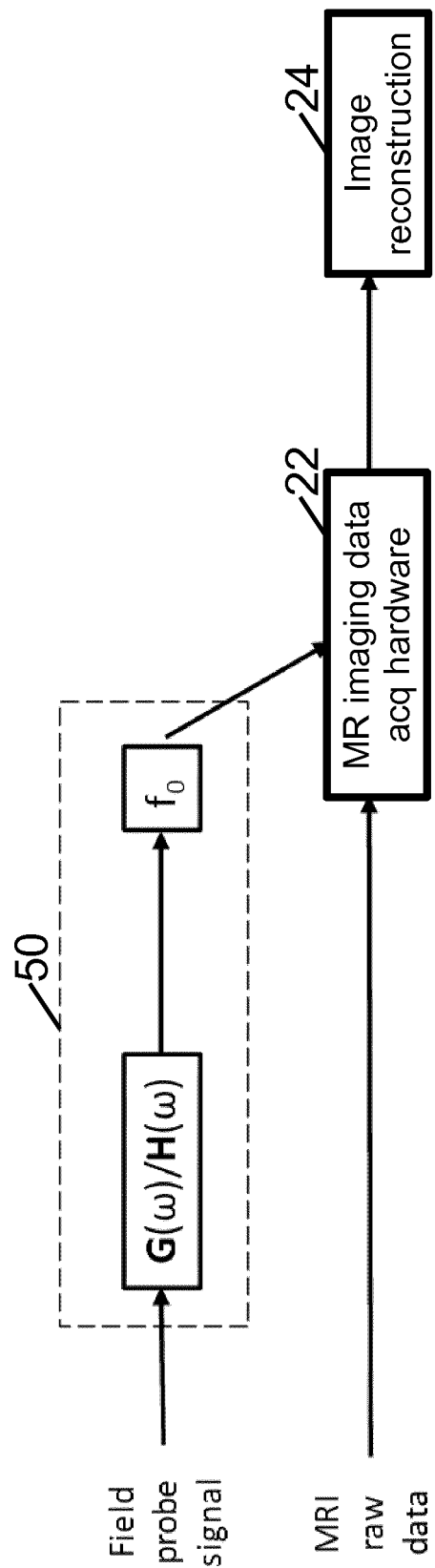
FIG. 6 diagrammatically shows an illustrative embodiment of the active $B_0$ compensation component of the MR imaging device of claim 1 in which the active $B_0$ compensation is implemented by frequency adjustment.

With reference now to FIG. 6, an illustrative embodiment of the active $B_0$ compensation component 50 is described, which provides active $B_0$ magnetic field compensation based on the electric current flowing in the superconducting $B_0$ compensation circuit 30 (or in the circuit 60, or in the circuit 70) by adjusting the MR frequency of the MR imaging data acquired by the MR imaging device 8. In this approach, a transfer function is used to handle the gain and frequency-dependent character of the magnetic field sensing. The magnetic field sensor 44 is located inside the cryostat 12, which is a metallic enclosure that behaves as a low pass filter for magnetic fields; accordingly, the sensitivity of the magnetic field sensor 44 will decrease as the frequency of the external disturbance increases. This can be corrected using a transfer function that has been measured or calculated, for example once during the development phase of the superconducting magnet 10. The measurement can be done as follows. It requires a source coil that generates homogeneous external field at the magnet. Next, when driving this source coil with a frequency sweep, the field should be measured with the magnetic field sensor 44 as well as with another calibrated probe that is located in the iso-center of the magnet 10 (this other calibrated probe will be operating at room temperature). Let $H(\omega)$ be the response measured with the cryogenic magnetic field sensor 44 and $G(\omega)$ the field response measured with the room-temperature calibrated probe at magnet iso-center. Then $G(\omega)$ is the net field resulting after passive $B_0$ compensation provided by the passive $B_0$ compensation circuit 30 (or circuit 60, or circuit 70); the remainder of the $B_0$ field variation is to be compensated actively. $H(\omega)$ is the sensor signal corresponding to that remaining field. So $G(\omega)/H(\omega)$ can be used as transfer function for the active $B_0$ compensation (this sets the gain as well as frequency correction for signals measured by the cryogenic magnetic field sensor 44). The corrected signal is then is used by the MR imaging device 8 to compensate the remaining deviations in $B_0$. This can be done in several ways as previously described, e.g. by correcting the MR data, or adjusting the RF frequency, or by applying a compensatory magnetic field. In the illustrative embodiment of FIG. 6, the signal is converted to a corrected MR frequency $f_0$ that is fed to the MR imaging data acquisition hardware 22 as a frequency correction. This active $B_0$ compensation approach is based on the observation that shifting $B_0$ or $f_0$ are equivalent because of the gyromagnetic relation 42.58 MHz/T. The shifted MR frequency $f_0$ can be done in software, as in FIG. 6, by correction of the raw MR data. Alternatively, as indicated by the dashed output arrow from the active $B_0$ compensation component 50 shown in FIG. 1, this corrected MR frequency $f_0$ can be applied in hardware by shifting the frequency of the RF transceiver hardware 20.

Typically, the active $B_0$ compensation component 50 comprises an electronic processor (e.g. a computer, microcontroller or so forth) programmed to implement the foregoing signal processing as digital signal processing (DSP) implementing the transfer function $G(\omega)/H(\omega)$ and the conversion to corrected MR frequency $f_0$. For software-based correction, this can be integral with the MR imaging data processing software, e.g. implementing the image reconstruction 24. For embodiments in which the RF transceiver hardware 20 is controlled, the approach may feed corrected $f_0$ into a digital or analog frequency setpoint control of this hardware 20. In alternative embodiments, it is contemplated to implement the signal processing using analog signal processing circuitry, e.g. employing operational amplifier (op amp)-based circuitry, optionally with an analog-to-digital (A/D) converter if a digital corrected $f_0$ output is required.

The illustrative $B_0$ compensation embodiments compensate the homogeneous part of the external disturbing field, which is usually sufficient. In other contemplated embodiments, $B_0$ compensation can be similarly applied for the x-, y- and/or z-gradients of the external disturbing field. The approach is analogous to the correction of the homogeneous part of the disturbance field, but the geometry of the pickup coils is chosen to resemble that of the x- y- and z-gradient coils. This extension improves compensation for disturbance sources located close to the magnet.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A superconducting magnet comprising:
a magnet cryostat;
superconducting magnet coils ($C_1$, $C_2$, $C_3$, $C_4$, $C_5$, $C_6$, $S_1$, $S_2$) disposed inside the magnet cryostat and configured to generate a static ($B_0$) magnetic field when an electric current flows in the superconducting magnet coils;
a superconducting $B_0$ compensation circuit disposed inside the magnet cryostat and coupled with the superconducting magnet coils to reduce temporal variations in the $B_0$ magnetic field generated by the superconducting magnet coils; and
an electric current sensor disposed inside the magnet cryostat and connected to measure electric current flowing in the superconducting $B_0$ compensation circuit and
an active $B_0$ compensation component operatively connected with the electric current sensor to receive the measurement of electric current flowing in the superconducting $B_0$ compensation circuit and configured to provide active $B_0$ magnetic field compensation based on the electric current flowing in the superconducting $B_0$ compensation circuit.

2. The superconducting magnet of claim 1 wherein:
a the active $B_0$ compensation component is configured to provide active $B_0$ magnetic field compensation based on the electric current flowing in the superconducting $B_0$ compensation circuit by adjusting a frequency ($f_0$) of magnetic resonance (MR) imaging data acquired by an MR imaging device that includes the superconducting magnet.

3. The superconducting magnet of claim 1 wherein:
a the active $B_0$ compensation component is configured to provide active $B_0$ magnetic field compensation based on the electric current flowing in the superconducting $B_0$ compensation circuit by adjusting a magnetic resonance (MR) frequency ($f_0$) of an MR imaging device that includes the superconducting magnet.

4. The superconducting magnet of claim 1 wherein:
a the active $B_0$ compensation component is configured to provide active $B_0$ magnetic field compensation based on the electric current flowing in the superconducting $B_0$ compensation circuit by generating a compensatory magnetic field.

5. The superconducting magnet of claim 1 wherein the electric current sensor comprises:
 a superconducting sensor coil electrically connected with the superconducting $B_0$ compensation circuit to generate a sensor coil magnetic field in response to the electric current flowing in the superconducting $B_0$ compensation circuit passing through the superconducting sensor coil; and
 a magnetic field sensor arranged to measure the sensor coil magnetic field.

6. The superconducting magnet of claim 5 wherein the magnetic field sensor comprises a Hall effect sensor.

7. The superconducting magnet of claim 5 wherein:
 the superconducting sensor coil is oriented to generate the sensor coil magnetic field oriented transverse to the $B_0$ magnetic field at the electric current sensor; and
 the magnetic field sensor is oriented to sense the sensor coil magnetic field and to not sense the $B_0$ magnetic field oriented transverse to the sensor coil magnetic field.

8. The superconducting magnet of claim 5 wherein the electric current sensor further comprises:
 a magnetic shield surrounding the superconducting sensor coil and the magnetic field sensor.

9. The superconducting magnet of claim 1 wherein the superconducting $B_0$ compensation circuit is coupled with the superconducting magnet coils by electrical connections.

10. The superconducting magnet of claim 1 wherein the superconducting $B_0$ compensation circuit includes compensation circuit coils ($CC_1$, $CC_2$) and is coupled with the superconducting magnet coils ($C_1$, $C_2$, $C_3$, $C_4$, $C_5$, $C_6$, $S_1$, $S_2$) by inductive coupling between the compensation circuit coils and the superconducting magnet coils.

11. The superconducting magnet of claim 10 wherein:
 the superconducting magnet coils ($C_1$, $C_2$, $C_3$, $C_4$, $C_5$, $C_6$, $S_1$, $S_2$) includes main coils ($C_1$, $C_2$, $C_3$, $C_4$, $C_5$, $C_6$) and shield coils ($S_1$, $S_2$); and
 the superconducting $B_0$ compensation circuit 70) is coupled with the superconducting magnet coils ($C_1$, $C_2$, $C_3$, $C_4$, $C_5$, $C_6$, $S_1$, $S_2$) by inductive coupling between the compensation circuit coils ($CC_1$, $CC_2$) and one of the main coils ($C_1$, $C_2$, $C_3$, $C_4$, $C_5$, $C_6$) and the shield coils ($S_1$, $S_2$).

12. A magnetic resonance (MR) imaging device comprising:
 a superconducting magnet as set forth in claim 1; and
 an active $B_0$ compensation component operatively connected with the electric current sensor to receive the measurement of electric current flowing in the superconducting $B_0$ compensation circuit and configured to provide active $B_0$ magnetic field compensation based on the electric current flowing in the superconducting $B_0$ compensation circuit.

13. A method of operating a superconducting magnet, the method comprising:
 using a magnet cryostat, cooling superconducting magnet coils ($C_1$, $C_2$, $C_3$, $C_4$, $C_5$, $C_6$, $S_1$, $S_2$) and a superconducting $B_0$ compensation circuit coupled with the superconducting magnet coils;
 electrically energizing the superconducting magnet coils to generate a static ($B_0$) magnetic field;
 reducing temporal variations in the $B_0$ magnetic field using the superconducting $B_0$ compensation circuit;
 using an electric current sensor disposed inside the magnet cryostat, measuring electric current flowing in the superconducting $B_0$ compensation circuit; and
 performing active $B_0$ compensation based on the measured electric current flowing in the superconducting $B_0$ compensation circuit.

14. The method of claim 13 wherein the performing of active $B_0$ compensation comprises:
 adjusting a frequency ($f_0$) of magnetic resonance (MR) imaging data acquired from a subject disposed in the static ($B_0$) magnetic field based on the measured electric current flowing in the superconducting $B_0$ compensation circuit.

15. The method of claim 13 wherein the performing comprises:
 adjusting a magnetic resonance (MR) frequency ($f_0$) of an MR imaging device configured to acquire MR imaging data from a subject disposed in the static ($B_0$) magnetic field based on the measured electric current flowing in the superconducting $B_0$ compensation circuit.

16. The method of claim 13 wherein the performing comprises:
 generating a compensatory magnetic field based on the measured electric current flowing in the superconducting $B_0$ compensation circuit.

17. A magnetic resonance (MR) imaging device comprising:
 a superconducting magnet including a magnet cryostat, superconducting magnet coils ($C_1$, $C_2$, $C_3$, $C_4$, $C_5$, $C_6$, $S_1$, $S_2$) disposed inside the magnet cryostat, a superconducting $B_0$ compensation circuit disposed inside the magnet cryostat and coupled with the superconducting magnet coils, and an electric current sensor disposed inside the magnet cryostat and connected to measure electric current flowing in the superconducting $B_0$ compensation circuit; and
 an active $B_0$ compensation component operatively connected with the electric current sensor to receive the measurement of electric current flowing in the superconducting $B_0$ compensation circuit and configured to provide active $B_0$ magnetic field compensation based on the electric current flowing in the superconducting $B_0$ compensation circuit.

18. The MR imaging device of claim 17 wherein the active $B_0$ compensation component is configured to provide active $B_0$ magnetic field compensation by adjusting a frequency ($f_0$) of magnetic resonance (MR) imaging data acquired by the MR imaging device.

19. The MR imaging device of claim 17 wherein the active $B_0$ compensation component is configured to provide active $B_0$ magnetic field compensation by adjusting a magnetic resonance (MR) frequency ($f_0$) of the MR imaging device.

20. The MR imaging device of claim 17 wherein the electric current sensor comprises:
 a superconducting sensor coil electrically connected with the superconducting $B_0$ compensation circuit; and
 a magnetic field sensor arranged to measure a magnetic field generated by the superconducting sensor coil.

* * * * *